(12) United States Patent
Forrest et al.

(10) Patent No.: US 7,694,200 B2
(45) Date of Patent: Apr. 6, 2010

(54) INTEGRATED CIRCUIT HAVING BUILT-IN SELF-TEST FEATURES

(75) Inventors: Glenn A. Forrest, Bow, NH (US); Washington Lamar, Mont Vernon, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 275 days.

(21) Appl. No.: 11/779,354

(22) Filed: Jul. 18, 2007

(65) Prior Publication Data
US 2009/0024889 A1    Jan. 22, 2009

(51) Int. Cl.
*G01R 31/28* (2006.01)
*G06F 11/00* (2006.01)
(52) U.S. Cl. ..................................... 714/733
(58) Field of Classification Search .................. None
See application file for complete search history.

(56) References Cited

U.S. PATENT DOCUMENTS

| | | | |
|---|---|---|---|
| 4,004,217 A | 1/1977 | Giffard | |
| 5,793,778 A | 8/1998 | Qureshi | |
| 6,191,698 B1 * | 2/2001 | Hennig et al. | 340/686.6 |
| 6,420,868 B1 | 7/2002 | Ganther, Jr. et al. | |
| 6,545,495 B2 * | 4/2003 | Warmack et al. | 324/762 |
| 6,980,005 B2 * | 12/2005 | Finlay et al. | 324/424 |
| 7,096,386 B2 * | 8/2006 | Ozawa | 714/30 |
| 7,327,153 B2 * | 2/2008 | Weinraub | 324/763 |
| 2004/0059959 A1 | 3/2004 | Ozawa | |
| 2007/0096759 A1 | 5/2007 | Weinraub | |

FOREIGN PATENT DOCUMENTS

WO    WO/2006/056829    6/2006

OTHER PUBLICATIONS

PCT Search Report of the ISA for PCT/US2008/067060 dated Sep. 19, 2009.
PCT Written Opinion of the ISA for PCT/US2008/067060 dated Sep. 19, 2009.

* cited by examiner

*Primary Examiner*—Christine T Tu
(74) *Attorney, Agent, or Firm*—Daly, Crowley, Mofford & Durkee, LLP (57) ABSTRACT

An integrated circuit and a method of built-in self test in the integrated circuit employ an offset control node and offset capabilities with the integrated circuit in order to communicate and distribute a built-in self-test signal. The built-in self-test signal can emulate signals internal to the integrated circuit during normal operation, and/or the built-in self-test signal can have other signal characteristics representative of signals other than those signals internal to the integrated circuit during normal operation.

26 Claims, 6 Drawing Sheets

INTEGRATED CIRCUIT HAVING BUILT-IN SELF-TEST FEATURES

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to integrated circuits and, more particularly, to integrated circuits that have built-in self-test features.

BACKGROUND OF THE INVENTION

Proximity detectors for detecting ferromagnetic articles are also known. In proximity detectors, the magnetic field associated with the ferromagnetic is detected by a magnetic field-to-voltage transducer (also referred to herein as a magnetic field sensing element), such as a Hall element or a magnetoresistance element, which provides a signal (i.e., a magnetic field signal) proportional to a detected magnetic field.

Some proximity detectors merely provide an output signal representative of the proximity of the ferromagnetic article. However, other proximity detectors, i.e., rotation detectors, provide an output signal representative of the approach and retreat of each tooth of a rotating ferromagnetic gear or of each segment of a segmented ring magnet having segments with alternating polarity. The proximity detector (rotation detector) processes the magnetic field signal to generate an output signal that changes state each time the magnetic field signal either reaches a peak (positive or negative peak) or crosses a threshold level. Therefore, the output signal, which has an edge rate or period, is at least indicative of a rotation and a speed of rotation of the ferromagnetic gear or of the ring magnet.

In one type of proximity detector (rotation detector), sometimes referred to as a peak-to-peak percentage detector (or threshold detector), a threshold level is equal to a percentage of the peak-to-peak magnetic field signal. One such peak-to-peak percentage detector is described in U.S. Pat. No. 5,917,320 entitled "Detection of Passing Magnetic Articles While Periodically Adapting Detection Threshold" assigned to the assignee of the present invention and incorporated herein by reference.

Another type of proximity detector (rotation detector), sometimes referred to as a slope-activated detector or as a peak-referenced detector (or peak detector), is described in U.S. Pat. No. 6,091,239 entitled "Detection Of Passing Magnetic Articles With a Peak Referenced Threshold Detector," which is assigned to the assignee of the present invention. Another such peak-referenced proximity detector is described in U.S. Pat. No. 6,693,419, entitled "Proximity Detector," which is assigned to the assignee of the present invention and incorporated herein by reference. Another such peak-referenced proximity detector is described in U.S. Pat. No. 7,199,579, entitled "Proximity Detector," which is assigned to the assignee of the present invention and incorporated herein by reference. In the peak-referenced proximity detector, the threshold signal differs from the positive and negative peaks (i.e., the peaks and valleys) of the magnetic field signal by a predetermined amount. Thus, in this type of proximity detector, the output signal changes state when the magnetic field signal comes away from a peak or valley by the amount.

It should be understood that, because the above-described peak-to-peak percentage detector and the above-described peak-referenced detector both have circuitry that can identify the positive and negative peaks of a magnetic field signal, the peak-to-peak percentage detector and the peak-referenced detector both include a peak detector circuit adapted to detect a positive peak and a negative peak of the magnetic field signal. Each, however, uses the detected peaks in different ways.

In order to accurately detect the positive and negative peaks of a magnetic field signal, some proximity detectors, i.e., rotation detectors, are capable of tracking at least part of the magnetic field signal. To this end, typically, one or more digital-to-analog converters (DACs) can be used to generate a tracking signal, which tracks the magnetic field signal. For example, in the above-referenced U.S. Pat. Nos. 5,917,320 and 6,091,239, two DACs are used; one (PDAC) to detect the positive peaks of the magnetic field signal and the other (NDAC) to detect the negative peaks of the magnetic field signal.

Some proximity detectors are configured to be able to identify a vibration, for example, either a rotational vibration or a linear vibration of a gear or ring magnet, which vibration can generate signals from a magnetic field sensing element (magnetic field signals) that might appear similar to signals that would be generated during a rotation of the gear or ring magnet in normal operation. Proximity detectors having vibration processors that can detect a vibration are described in U.S. patent application Ser. No. 10/942,577, filed Sep. 16, 2004, entitled "Methods and Apparatus for Vibration Detection," and in U.S. patent application Ser. No. 11/085,648, filed Mar. 21, 2005, entitled "Proximity Detector Having a Sequential Flow State Machine," both of which are assigned to the assignee of the present invention and incorporated herein by reference.

As is known, some integrated circuits have internal built-in self-test (BIST) capabilities. A built-in self-test is a function that can verify all or a portion of the internal functionality of an integrated circuit. Some types of integrated circuits have built-in self-test circuits built directly onto the integrated circuit die. Typically, the built-in self-test is activated by external means, for example, a signal communicated from outside the integrated circuit to dedicated pins or ports on the integrated circuit. For example, an integrated circuit that has a memory portion can include a built-in self-test circuit, which can be activated by a self-test signal communicated from outside the integrated circuit. The built-in self-test circuit can test the memory portion of the integrated circuit in response to the self-test signal.

SUMMARY OF THE INVENTION

The present invention employs an offset control node and offset capabilities with an integrated circuit in order to communicate and distribute a built-in self-test signal. The built-in self-test signal can emulate signals internal to the integrated circuit during normal operation, and/or the built-in self-test signal can have other signal characteristics representative of signals other than those signals internal to the integrated circuit during normal operation.

In accordance with one aspect of the present invention, a method of built-in self-test in an integrated circuit includes communicating a built-in self-test control signal to the integrated circuit, generating one or more analog self-test signals within the integrated circuit, and coupling the one or more analog self-test signals to a respective one or more offset control nodes within the integrated circuit in response to the communicating.

In accordance with another aspect of the present invention, an integrated circuit includes one or more built-in self-test signal generators for generating a respective one or more digital self-test signals. The integrated circuit also includes one or more digital-to-analog converters coupled respectively to the one or more built-in self-test signal generators, the one or more digital-to-analog converters for generating a respective one or more analog self-test signals in response to the one or more digital self-test signals. The integrated circuit also includes a built-in self-test control node for receiving a built-in self-test control signal. The integrated circuit also includes one or more offset control nodes coupled to receive respectively the one or more analog self-test signals in response to the built-in self-test control signal.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "digital" is used to describe a numerically represented signal. The digital signal can be a binary signal, having one or more "bits," each bit having two states, or it can be a non-binary signal, having one or more "bits," each bit having more than two states.

Figure 1:
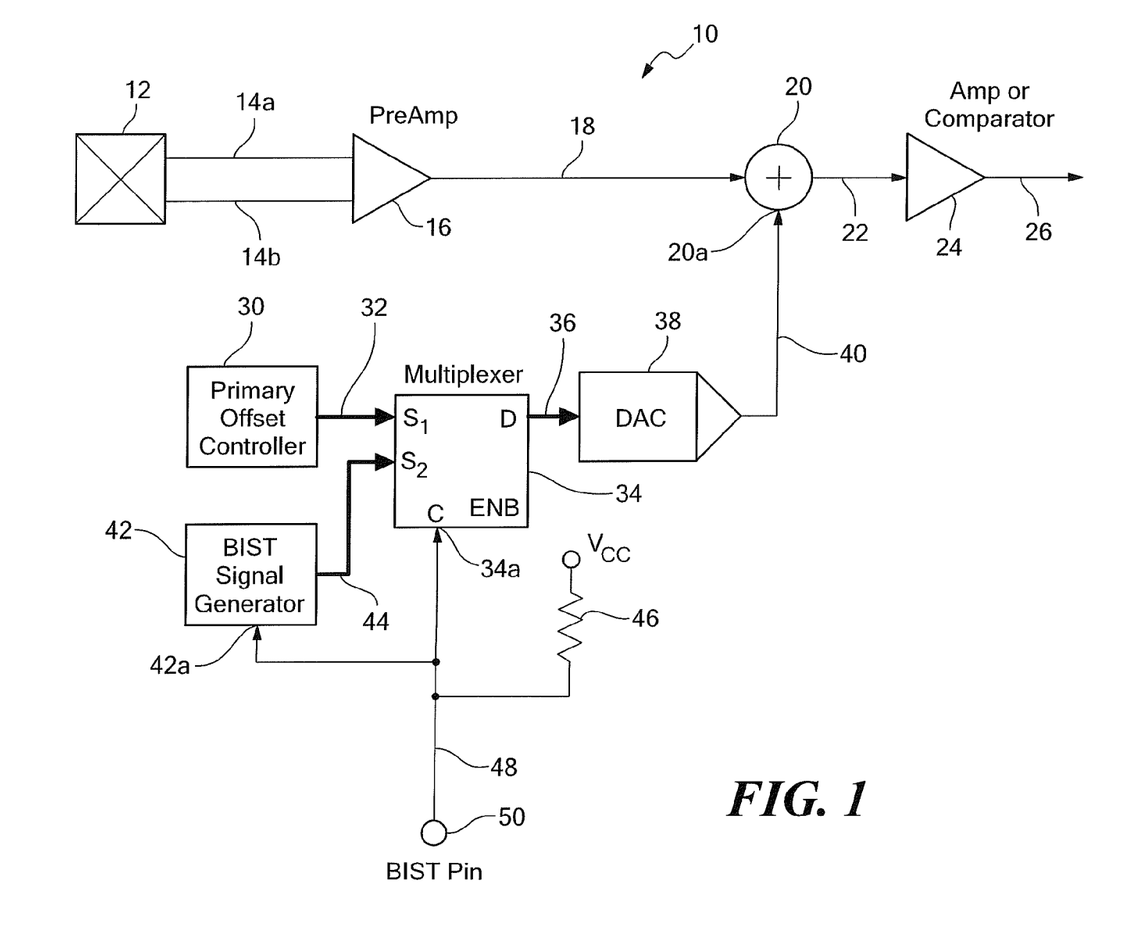
FIG. 1 is a block diagram showing an integrated circuit having a built-in self-test (BIST) signal generator.

Referring to FIG. 1, an integrated circuit 10 includes a magnetic field sensing element 12. The magnetic field sensing element 12 can be one of a variety of types of magnetic field sensing elements, including, but not limited to, a Hall effect element and a magnetoresistance element. The magnetic field sensing element 12 generates a sensing element output signal 14a, 14b, (or more simple a sensor output signal), here shown to be a differential sensor output signal 14a, 14b.

The integrated circuit can also include a preamplifier 16 coupled to receive the sensor output signal 14a, 14b and configured to generate an amplified signal 18, which is also sometimes referred to herein as a "magnetic field signal." The integrated circuit 10 can also include a summation circuit 20 coupled to receive the amplified signal 18. The summation circuit 20 is configured to generate a summation signal 22. The integrated circuit 10 can also include a comparator 24 (or in an alternate arrangement, an amplifier 24) coupled to receive the summation signal 22 and configured to generate an output signal 26.

The integrated circuit 10 can also include a primary offset controller 30 configured to generate an offset signal 32. The integrated circuit 10 can also include a built-in self-test (BIST) signal generator 42 configured to generate a digital self-test signal 44. The integrated circuit 10 can also include a logic circuit 34, here shown to be a multiplexer 34, configured to receive the offset signal 32 and to receive the digital self-test signal 44 and configured to generate a multiplexer output signal 36 as at least one of the digital self-test signal 44 or the offset signal 32. The selection of which one of the digital self-test signal 44 or the offset signal 32 to provide as the multiplexer output signal 36 is made by the state of a built-in self-test control signal 48 received at a built-in self-test control node (or pin) 50 and communicated to a control port 34a on the multiplexer 34.

The integrated circuit 10 can also include a digital-to-analog converter 38 coupled to receive the multiplexer output signal 36, which is at least one of the digital self-test signal 44 or the offset signal 32. The digital-to-analog converter 38 is configured to generate an analog self-test signal 40 in response to receiving the digital self-test signal 44. The summation circuit 20 is further coupled to receive the analog self-test signal 40 at an offset control port 20a and to sum the analog self-test signal 40 with the amplified signal 18 to provide the summation signal 22.

As described above, the built-in self-test control node (or pin) 50 is for receiving the built-in self-test control signal 48 and for communicating the self-test control signal 48 to the control node 34a of the multiplexer 34 and also to a control node 42a of the BIST signal generator 42. The built-in self-test control signal 48 can have at least two states, for example, a high state and a low state.

In a normal non-self-test mode of operation, in response to one of the states of the built-in self-test control signal 48, for example, a high state, the multiplexer 34 allows the offset signal 32 to couple to the digital-to-analog converter 38. In this mode of operation, the signal 40 is merely an analog offset signal selected by the primary offset controller 30 to center the summation signal 22 at some desired DC voltage.

In self-test operation, in response to another one of the states of the built-in self-test control signal 48, for example, a low state, the BIST signal generator 42 can begin to generate the digital self-test signal 44. Also in response to the same state of the self-test control signal 48, the multiplexer can switch paths to allow the digital self-test signal 44 to couple to the digital-to-analog converter 38, instead of, or in addition to, the offset signal 32. In response, the digital-to-analog converter 38 generates the analog self-test signal 40. In other arrangements, the BIST signal generator 42 generates the digital self-test signal 44 continuously, regardless of a state of the built-in self-test control signal 48, but the digital self-test signal 44 is received at the DAC 38 only in accordance with the state of the built-in self-test control signal 48. In some arrangements, the offset controller 30 is not used, in which case, the multiplexer 34 can be replaced with an electronic switch.

Though the summation circuit 20 is configured to receive both the analog self-test signal 40 and the amplified signal 18, during a built-in self-test, the amplified signal 18 can have little or no signal content, i.e., it can be a DC signal. However, the amplified signal 18 (i.e., the magnetic field signal) can also have AC signal components during the built-in self-test.

In some arrangements, the analog self-test signal 40 can be a signal that emulates a magnetic field signal 18 that the integrated circuit 10 generates in real operation in the presence of a magnetic field, either DC or AC. Therefore, the analog self-test signal 40 can test portions of the integrated circuit 10 in a way that the portions would actually be used.

In other arrangements, the analog self-test signal 40 can be any signal that exercises particular aspects of the integrated circuit 10. For example, the analog self-test signal 40 can include a maximum or a minimum signal amplitude representative of an amplitude range of the magnetic field signal 18 that the integrated circuit 10 is expected to generate. For another example, the analog self-test signal 40 can include a frequency component representative of a frequency range of the magnetic field signal 18 that the integrated circuit 10 is expected to generate. For another example, the analog self-test signal 40 can include noise components representative of phase or amplitude noise.

By observing the output signal 26 while the analog self-test signal 40 is provided at least in part by the digital self-test signal 44, it may be determined whether the integrated circuit 10 is functioning properly or whether the integrated circuit 10 is experiencing a failure.

The BIST signal generator 42 can generate the digital self-test signal 44, resulting in the analog self-test signal 40 having one aspect, for example one frequency or one amplitude, or it can generate the analog self-test signal 40 having a plurality of aspects, one at a time in series, or together at the same time. For example, the BIST signal generator 42 can generate the analog self-test signal 40 having a plurality of frequencies, each with a different amplitude or with the same amplitude. In some arrangements, the BIST signal generator 42 can also generate the analog self-test signal 40 having noise, either phase noise, amplitude noise, or both.

During a built-in self-test, the BIST signal generator 42 can generate the digital self-test signal 44, and therefore, the analog self-test signal 40, and therefore, the summation signal 22, to have a signal characteristic representative of the magnetic field signal 18 generated when the sensing element 12 is experiencing a magnetic field during normal operation. Therefore, the BIST signal generator 42 can generate the analog self-test signal 40 to emulate real operation of the integrated circuit 10 when in the presence of the magnetic field. For example, the signal characteristic can be representative of a ferromagnetic article in proximity to the magnetic field sensing element 12. To this end, the analog self-test signal 40 can be a substantially DC signal or a slowly changing signal. For another example, the signal characteristic can be representative of a rotation of the ferromagnetic article, for example, a rotating gear or segmented ring magnet in proximity to the magnetic field sensing element 12. To this end, the analog self-test signal 40 can be an AC signal. For another example, the signal characteristic can be representative of a vibration, for example a rotational or linear vibration of the gear or ring magnet. To this end, the analog self-test signal 40 can include a phase change, e.g., phase noise, and/or an amplitude modulation, e.g., amplitude noise.

Figure 2:
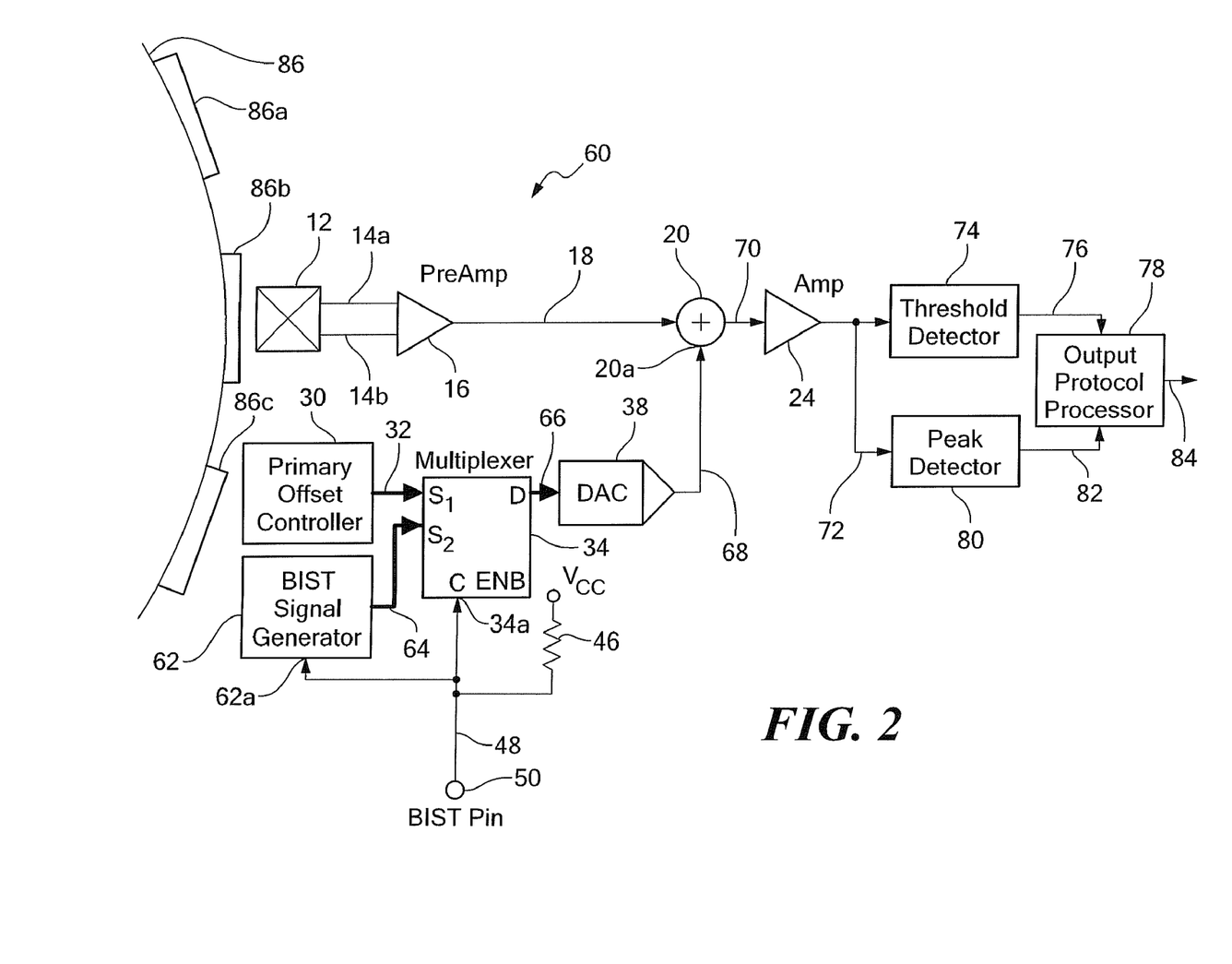
FIG. 2 is a block diagram showing another integrated circuit having a built-in self-test (BIST) signal generator.

Referring now to FIG. 2, in which like elements of FIG. 1 are shown having like reference designations, an integrated circuit 60 can be in the form of a rotation sensor, which, in some applications is in proximity to a rotating gear 86 having gear teeth 86a-86c. However, in some other applications, the integrated circuit 60 is instead in proximity to a segmented ring magnet having alternately polarized segments about its circumference.

The integrated circuit 60 can include a threshold detector 78 and/or a peak detector 80, both coupled to receive a signal 72 which is an amplified or buffered version of a summation signal 70, and which is, therefore, referred to herein as a buffered summation signal 72. The summation signal 70 is the same as or similar to the summation signal 22 of FIG. 1, however, as will become apparent from discussion below, the summation signal 70 can also have different signal characteristics than the summation signal 22.

The threshold detector 74 is configured to generate an output signal 76 and the peak detector is configured to generate an output signal 82, both of which can be square waves described more fully below. An output protocol processor 78 can combine the output signals 76, 82 in order to generate an output signal 84 from the integrated circuit 60. The output signal 84 can also be a square wave having a frequency the same as the frequency of an AC magnetic field experienced by the magnetic field sensing element 12 due to a rotation of the gear 86.

It will be understood, particularly in view of the above-described patents and patent applications, that the integrated circuit 60 can detect rotation, for example, rotation of the gear 86. In essence, the output signals 76 and 82 as well as the output signal 84 are square waves when the magnetic field sensor is in proximity to the rotating gear 86. Each output signal square wave has a frequency related to the frequency with which the gear teeth 86a-86c pass by the magnetic field sensor 12.

As described above, threshold detectors and peak detectors are known. During normal non-self-test operation, the buffered summation signal 72 is representative of an AC magnetic field signal 18, and the output signal 82 generated by the peak detector 80 has edges generally aligned with positive and negative peaks of the buffered summation signal 72, i.e., with positive and negative peaks of the magnetic field signal 18. In contrast, the output signal 76 generated by the threshold detector 74 has edges generally aligned with one or two thresholds crossed by the buffered summation signal 72.

The integrated circuit 60 can also include a BIST signal generator 62 configured to generate a digital self-test signal 64, resulting in an analog self-test signal 68. In response, the summation circuit 20 is configured to generate the summation signal 72. The BIST signal generator 62 can be the same as or similar to the BIST signal generator 42 of FIG. 1. However, the BIST signal generator 62 can also be different than the BIST signal generator 42.

In some arrangements, the analog self-test signal 68 can be a signal that emulates a magnetic field signal 18 that the integrated circuit 60 generates in real operation, for example, in response to passing gear teeth 86a-86c. Therefore, the analog self-test signal 68 can test portions of the integrated circuit 60 in a way that the portions would actually be used.

In other arrangements, the analog self-test signal 68 can be any signal that exercises particular aspects of the integrated circuit 60. For example, the analog self-test signal 40 can include a maximum or a minimum signal amplitude representative of an amplitude range of the magnetic field signal 18 that the integrated circuit 60 is expected to generate. For another example, the analog self-test signal 68 can include a frequency component representative of a frequency range of the magnetic field signal 18 that the integrated circuit 60 is expected to generate. For another example, the analog self-test signal 68 can include noise components representative of phase or amplitude noise.

By observing the output signal 84 while the analog self-test signal 68 is provided at least in part by the digital self-test signal 64, it may be determined whether the integrated circuit 60 is functioning properly or whether the integrated circuit 60 is experiencing a failure.

The BIST signal generator 62 can generate the digital self-test signal 64, resulting in the analog self-test signal 68 having one aspect, for example one frequency or one amplitude, or it can generate the analog self-test signal 68 having a plurality of aspects, one at a time in series, or together at the same time. For example, the BIST signal generator 62 can generate the analog self-test signal 68 having a plurality of frequencies, each with a different amplitude or with the same amplitude. In some arrangements, the BIST signal generator 62 can also generate the analog self-test signal 62 having noise, either phase noise, amplitude noise, or both.

During a built-in self-test, the BIST signal generator 62 can generate the digital self-test signal 64, and therefore, the analog self-test signal 68, and therefore, the summation signal 72, to have a signal characteristic representative of the magnetic field signal 18 generated when the sensing element 12 is experiencing a magnetic field during normal operation. Therefore, the BIST signal generator 62 can generate the analog self-test signal 68 to emulate real operation of the integrated circuit 60 when in the presence of the magnetic field. For example, the signal characteristic can be representative of a rotation of the ferromagnetic article, for example, the rotating gear 86 or segmented ring magnet in proximity to the magnetic field sensing element 12. To this end, the analog self-test signal 40 can be an AC signal. For another example, the signal characteristic can be representative of a vibration, for example a rotational or linear vibration of the gear 86. To this end, the signal characteristic can include a phase change, e.g., phase noise, of the analog self-test signal 40, and/or an amplitude modulation, e.g., amplitude noise, of the analog self-test signal 68.

Figure 3:
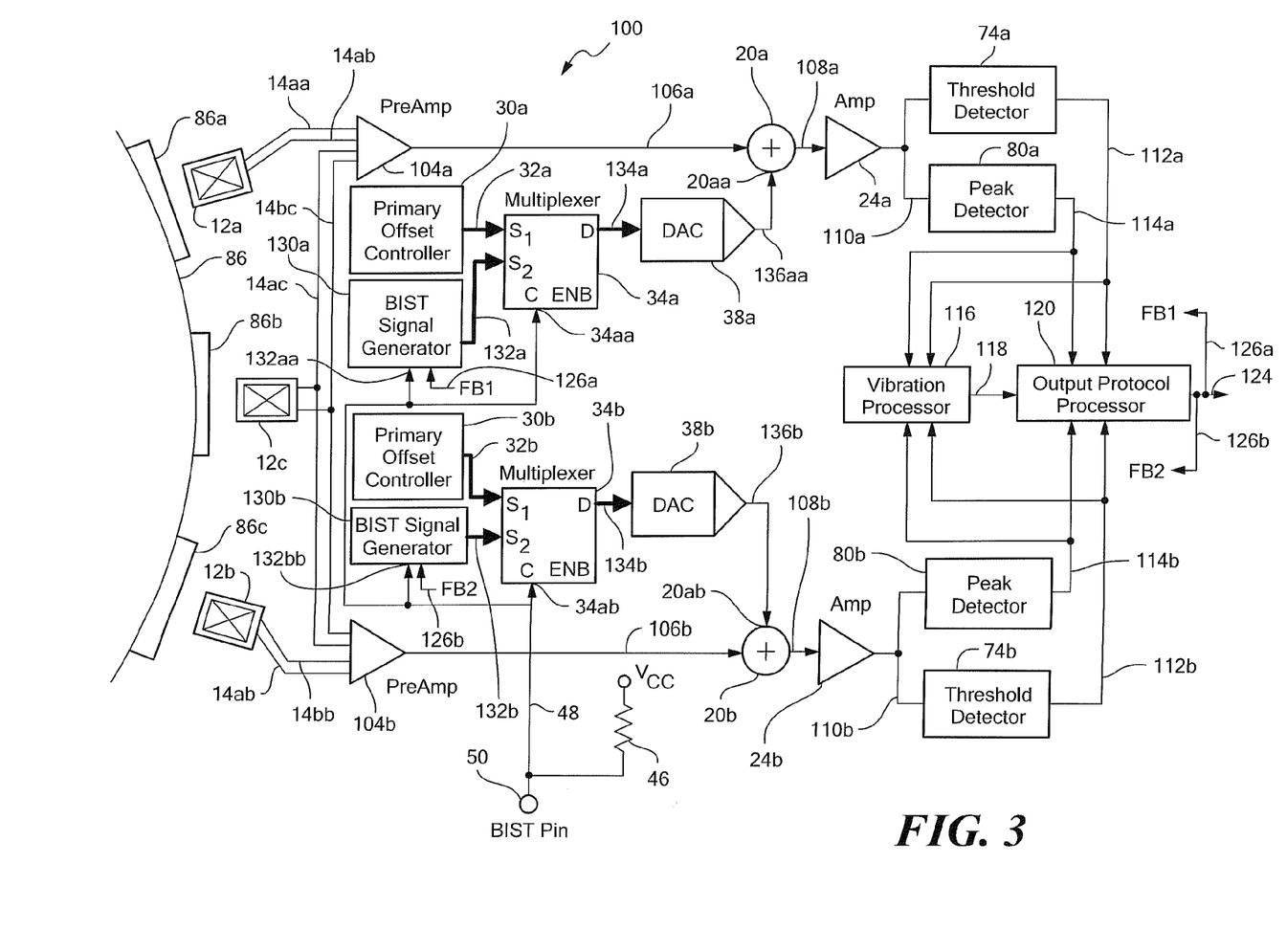
FIG. 3 is a block diagram showing yet another integrated circuit having two built-in self-test (BIST) signal generators.

Referring now to FIG. 3, in which like elements of FIGS. 1 and 2 are shown having like reference designations, an integrated circuit 100 can have two channels the same as or similar to the one channel within the integrated circuit 60 of FIG. 2. Some of the components of FIGS. 1 and 2 are shown having like reference designations, but with trailing letters, for example, the summing circuits 20a, 20b. The trailing letters are merely indicative of separate channels, but the associated components can be the same as or similar to similarly designated components of FIGS. 1 and 2.

The integrated circuit 100 can be in the form of a rotation sensor, which, in some applications is in proximity to a gear 86 having gear teeth 86a-86c. However, in some other applications, the integrated circuit 100 is instead in proximity to a segmented ring magnet having alternately polarized segments about its circumference.

The integrated circuit can include preamplifiers 104a, 104b, each coupled to receive sensing element signals from two of the sensing elements 12a-12c. Thus, the preamplifiers 104a, 104b provide difference (DIFF) signals 106a, 106b, respectively, which are each a difference of signals provided by magnetic field sensing elements 12a-12c coupled respectively to the preamplifiers 104a, 104b.

The summing circuits 20a, 20b can be coupled to receive the difference signals 106a, 106b, respectively, and configured to generate summation signals 108a, 108b, respectively.

The amplifiers (or buffers) 24a, 24b can be coupled to receive the summation signals 108a, 108, respectively, and configured to generate buffered summation signals 110a, 110b, respectively. The buffered summation signal 110a can be received by the threshold detector 74a and by the peak detector 80a, which are configured to generate output signals 112a, 114a, respectively. Similarly, the buffered summation signal 110b can be received by the threshold detector 74b and by the peak detector 80b, which are configured to generate output signals 112b, 114b, respectively.

A vibration processor 116 is coupled to receive the output signals 112a, 112b, 114a, 114b and configured to generate a vibration output signal 118. An output protocol processor 120 is also coupled to receive the output signals 112a, 112b, 114a, 114b and configured to generate an output signal 124.

It will be understood, particularly in view of the above-described patents and patent applications, that the integrated circuit 100 can detect rotation of the gear 86. In essence, the output signals 112a, 112b, 114a, and 114b as well as the output signal 124 are square waves when the magnetic field sensing elements 12a-12c are in proximity to the rotating gear 86.

Each output signal square wave has a frequency related to the frequency with which gear teeth 86a-86c pass by the magnetic field sensors 12a-12c.

In addition, because the integrated circuit 100 has two channels, the integrated circuit 100 is able to detect a direction of rotation of the gear, for example, by way of a relative phase between the signals 112a and 112b or a relative phase between the signals 114a and 114b. In addition, a change in direction of rotation of the gear 86 can be identified as a change of relative phase accordingly. For example, in one direction of rotation of the gear 86, the phase of the output signal 112a may lead the phase of the output signal 112b and/or the phase of the output signal 114a may lead the phase of the output signal 114b. However, in the other direction of rotation, the phase of the output signal 112b may lead the phase of the output signal 112a and/or the phase of the output signal 114b may lead the phase of the output signal 114a. The direction of rotation can be encoded upon the output signal 124 in a variety of ways.

It will be also understood, particularly in view of the above-described patents and patent applications, that the vibration processor 116 can detect rotational vibration and/or translational vibration of the gear 86 and/or of the magnetic field sensing elements 12a-12c. Proximity detectors that can detect a vibration are described in U.S. patent application Ser. No. 10/942,577, filed Sep. 16, 2004, entitled "Methods and Apparatus for Vibration Detection" and in U.S. patent application Ser. No. 11/085,648, filed Mar. 21, 2005, entitled "Proximity Detector Having a Sequential Flow State Machine." In response to the detected vibration, the vibration processor 116 can change the encoding of the output signal 124. In some particular arrangements, when a vibration is detected, the vibration processor 116 operates to stop or blank the output signal 124 by way of the vibration signal 118.

The integrated circuit 100 can also include BIST signal generators 130a, 130b configured to generate digital self-test signals 132a, 132b, respectively, resulting in respective analog self-test signals 136a, 136b. The BIST signal generators 130a, 130b can be the same as or similar to the BIST signal generators 42, 62 of FIGS. 1 and 2, respectively. However, the BIST signal generators 130a, 130b can also be different than the BIST signal generators 42, 62. For example, the BIST signal generators 130a, 130b can be configured to receive feedback signals 126a, 126b representative of the output signal 124. Function of the feedback signals 126a, 126b is described more fully below.

In some arrangements, the analog self-test signals 136a, 136b can be signals that emulate DIFF signals 106a, 106b signals that the integrated circuit 100 generates 86a-86c in real operation. Therefore, the analog self-test signals 136a, 136b can test portions of the integrated circuit 100 in a way that the portions would actually be used.

In other arrangements, the analog self-test signals 136a, 136b can be any signals that exercise particular aspects of the integrated circuit 100. For example, the analog self-test signals 136a, 136b can include maximum or a minimum signal amplitude representative of an amplitude range of the DIFF signals 106a, 106b that the integrated circuit 100 is expected to generate. For another example, the analog self-test signals 136a, 136b can include frequency components representative of a frequency range of the DIFF signals 106a, 106b that the integrated circuit 100 is expected to generate. For another example, the analog self-test signals 136a, 136b can include noise components representative of phase or amplitude noise.

By observing the output signal 124 while the analog self-test signals 136a, 136b are provided at least in part by the digital self-test signals 132a, 132b, respectively, it may be determined whether the integrated circuit 100 is functioning properly or whether the integrated circuit 100 is experiencing a failure.

The BIST signal generators 130a, 130b can generate the digital self-test signals 132a, 132b, resulting in the analog self-test signal 136a, 136b, each having one aspect, for example one frequency or one amplitude, or they can generate the analog self-test signals 136a, 136b having a plurality of aspects, one at a time in series, or together at the same time. For example, the BIST signal generators 130a, 130b can generate the analog self-test signal 136a, 136b, each having a plurality of frequencies, each frequency with a different amplitude or with the same amplitude. In some arrangements, the BIST signal generators 130a, 130b can also generate the analog self-test signal 136a, 136b having noise, either phase noise, amplitude noise, or both.

During a built-in self-test, the BIST signal generators 130a, 130b can generate the digital self-test signals 132a, 132b, and therefore, the analog self-test signals 136a, 136b, and therefore, the summation signals 108a, 108b, to have a signal characteristic representative of the DIFF signals 106a, 106b generated when the magnetic field sensing elements 12a-12c are experiencing a magnetic field during normal operation. Therefore, the BIST signal generators 130a, 130b can generate respective a self-test signals to emulates real operation of the integrated circuit 100 when in the presence of the magnetic field. For example, the signal characteristic can be representative of a rotation of the ferromagnetic article, for example, the rotating gear 86 or segmented ring magnet in proximity to the magnetic field sensing elements 12a-12c. To this end, the analog self-test signals 136a, 136b can be AC signals. For another example, the signal characteristic can be representative of a direction rotation of the gear 86. To this end, the analog self-test signals 136a, 136b can be AC signals with a relative phase separation. For another example, the signal characteristic can be representative of a change in direction of rotation of the gear 86. To this end, the analog self-test signals 136a, 136b can be AC signals and the characteristic can include a relative phase change between the analog self-test signals 136a, 136b. For another example, the signal characteristic can be representative of a vibration, for example a rotational or linear vibration of the gear 86. To this end, the signal characteristic can include a phase change, e.g., phase noise, of at least one of the analog self-test signals 136a, 136b and/or an amplitude modulation, e.g., amplitude noise, of at least one of the analog self-test signals 136a, 136b.

As described above, the analog self-test signals 136a, 136d can sequence through one or a variety of signal characteristics upon receipt of the built-in self-test control signal 48, essentially in a predetermined fashion. However, in some embodiments, the BIST signal generators 130a, 130b can receive the feedback signals 126a, 126b, and can change the analog self-test signals 136a, 136d in response to the feedback signals 126a, 126b. For example, if the BIST signal generators 130a, 130b receive a certain number of edge transitions in the feedback signals 126a, 126b, then the BIST signal generators 130a, 130b can change the analog self-test signals 136a, 136d, for example, change the relative phase.

Figure 4:
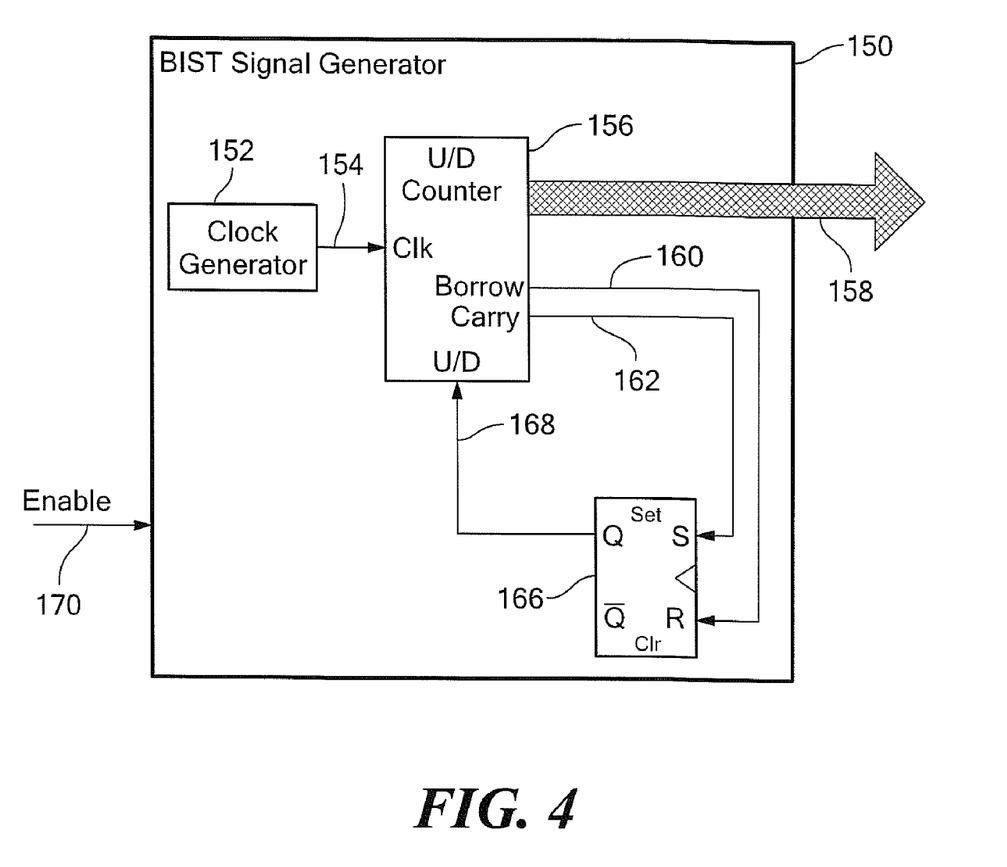
FIG. 4 is a block diagram showing a built-in self-test (BIST) signal generator that can be used in the integrated circuits of FIGS. 1-3.

Referring now to FIG. 4, a BIST signal generator 150 can be the same as or similar to any of the BIST signal generators 42, 62, or 130a and 130b of FIG. 103, respectively. However, the BIST signal generator 150 is not configured to receive the feedback signals 126a, 126b of FIG. 3.

The BIST signal generator 150 can include a clock generator 152 configured to generate a digital clock signal 154. The BIST signal generator 150 can also include a counter 156, which can be an up/down counter, coupled to receive the digital clock signal 154 and configured to generate a digital self-test signal 158. The digital self-test signal 158 can be the same as or similar to any of the digital self-test signals 44, 64, or 132a and 132b of FIGS. 1-3, respectively.

The counter 156 can generate a carry signal 162 when the counter 156 reaches a terminal count, and the counter 156 can generate a borrow signal 160 when the counter 156 reaches a minimum count. The BIST signal generator 150 can also include a logic gate 166, for example a flip-flop, coupled to receive the carry signal 160 and the borrow signal 162 and configured to generate an count direction control signal 168. The counter 156 reverses count direction depending upon a state of the count direction signal 168.

The BIST signal generator 150 can also include a control node 170, which can be the same as or similar to any of the nodes 42a, 62a, or 132a and 132b of FIGS. 1-3. The control node 170 is coupled to receive the built-in self-test control signal 48 of FIGS. 1-3.

In operation, the BIST signal generator 150 generates the digital self-test signal 158 during a particular state of the built-in self-test control signal 48 appearing at the control node 170. Therefore, the BIST signal generator 150 can be turned on or off by the state of the built-in self-test control signal 48.

When the BIST signal generator 150 is turned on, the digital self-test signal 158 is comprised of digital values that count periodically up to a terminal count of the counter 156, then down to the minimum count of the counter 156, until the BIST signal generator 150 is turned off by the built-in self-test control signal 48. When the digital self-test signal 158 is converted to one of the analog self-test signals 60, 68, 136a, or 136b of FIGS. 1-3, the analog self-test signal periodically ramps up and down, which is representative of but one type of analog self-test signal.

Figure 4A:
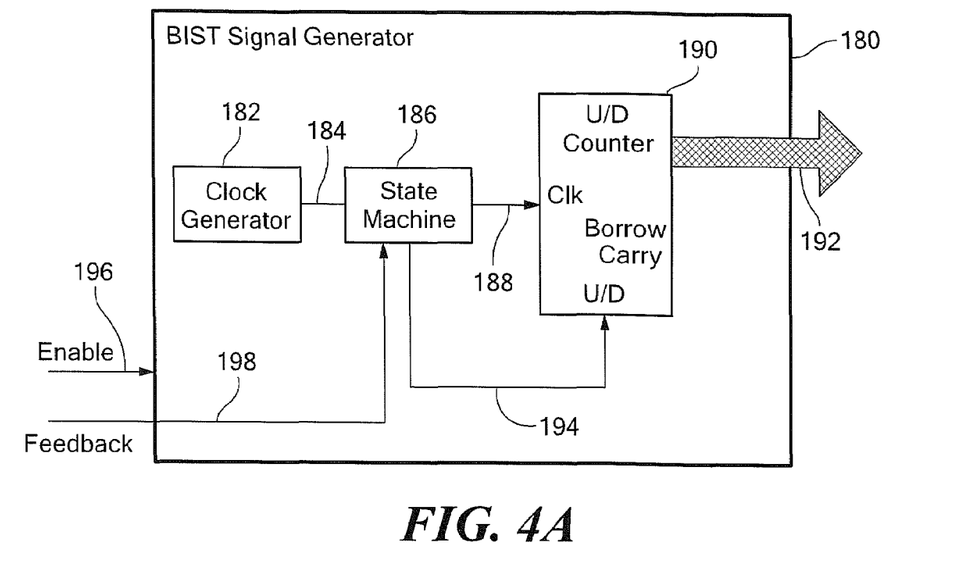
FIG. 4A is a block diagram showing another built-in self-test (BIST) signal generator that can be used in the integrated circuits of FIGS. 1-3.

Referring now to FIG. 4A, another BIST signal generator 180 can be the same as or similar to any of the BIST signal generators 42, 62, or 130a and 130b of FIGS. 1-3, respectively. The BIST signal generator 180 is configured to receive the feedback signals 126a, 126b of FIG. 3 at a feedback node 198.

The BIST signal generator 180 can include a clock generator 182 configured to generate a digital clock signal 184. The BIST signal generator 180 can also include a state machine 186, coupled to receive the digital clock signal 184 and configured to generate a state machine clock signal 188 and also configured to generate and count direction control signal 194. The BIST signal generator 180 can also include a counter 190, which can be an up/down counter, coupled to receive the state machine clock signal 188 and the count direction control signal 194 and configured to generate a digital self-test signal 192. The digital self-test signal 192 can be the same as or similar to any of the digital self-test signals 44, 64, or 132a and 132b of FIGS. 1-3, respectively.

The BIST signal generator 180 can also include a control node 196, which can be the same as or similar to any of the nodes 42a, 62a, or 132a and 132b of FIGS. 1-3. The control node 196 is coupled to receive the built-in self-test control signal 48 of FIGS. 1-3.

In operation, the BIST signal generator 180 generates the digital self-test signal 192 during a particular state of the built-in self-test control signal 48 appearing at the control node 196. Therefore, the BIST signal generator 180 can be turned on or off by the state of the built-in self-test control signal 48.

When the BIST signal generator 180 is turned on, the digital self-test signal 192 is comprised of digital values that count up or down in any fashion determined by the state machine 186, until the BIST signal generator 180 is turned off by the built-in self-test control signal 48. When the digital self-test signal 192 is converted to one of the analog self-test signals 60, 68, 136a, or 136b of FIGS. 1-3, the analog self-test signal can have any form determined by the state machine 186. Furthermore, as described above in conjunction with FIG. 3, the resulting analog self-test signals 60, 68, 136a, or 136b can be determined in part by the feedback signal appearing at the feedback node 198.

The BIST signal generator 180 is able to generate the digital self-test signals 192 resulting in the analog self-test signals 60, 68, 136a, or 136b of FIGS. 1-3 having any of the above described characteristics. For example, when one channel is used as in FIGS. 1 and 2, the analog self-test signals 60, 68, can include a signal characteristic representative of proximity of a ferromagnetic article, a signal characteristic representative of a rotation of the ferromagnetic article, and/or a signal characteristic representative of a rotational or translational noise of the ferromagnetic article. When two channels are used as in FIG. 3, the analog self-test signals 136a, 136b can include a signal characteristic representative of proximity of the ferromagnetic article, a signal characteristic representative of a rotation of the ferromagnetic article, a signal characteristic representative of a direction of rotation of the ferromagnetic article, a signal characteristic representative of a change in direction of rotation of the ferromagnetic article, and/or a signal characteristic representative of a rotational or translational noise of the ferromagnetic article.

Figure 4B:
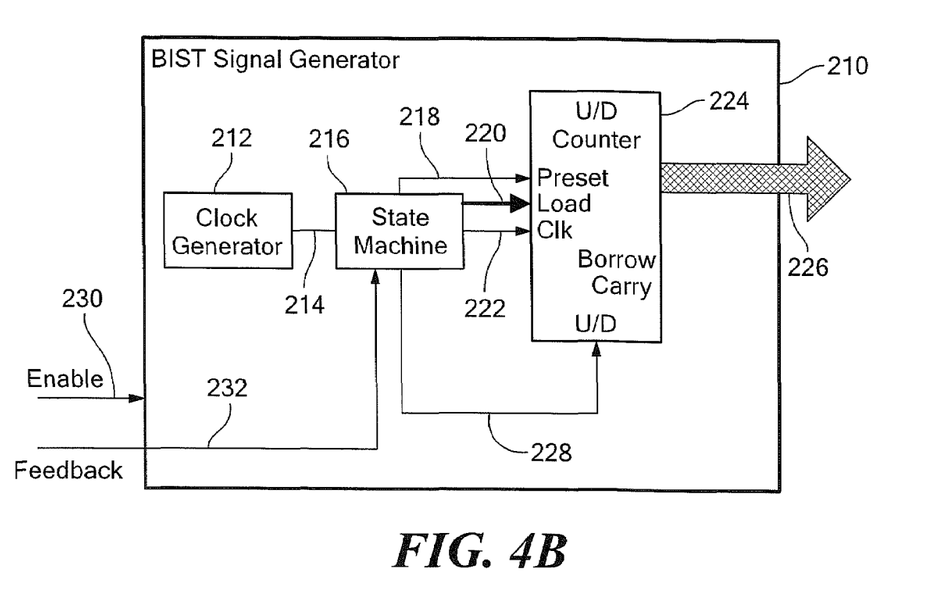
FIG. 4B is a block diagram showing yet another built-in self-test (BIST) signal generator that can be used in the integrated circuits of FIGS. 1-3.

Referring now to FIG. 4B, another BIST signal generator 210 can be the same as or similar to any of the BIST signal generators 42, 62, or 130a and 130b of FIGS. 1-3, respectively. The BIST signal generator 210 is configured to receive the feedback signals 126a, 126b of FIG. 3 at a feedback node 232.

The BIST signal generator 210 can include a clock generator 212 configured to generate a digital clock signal 214. The BIST signal generator 210 can also include a state machine 216 coupled to receive the digital clock signal 214 and configured to generate a state machine clock signal 222, a count direction control signal 228, a digital load count signal 220, and a preset signal 218.

The BIST signal generator 210 can also include a counter 224, which can be an up/down counter, coupled to receive the state machine clock signal 222, the count direction control signal 228, the digital load count signal 220, and the preset signal 218. The counter 224 is configured to generate a digital self-test signal 228. The digital self-test signal 228 can be the same as or similar to any of the digital self-test signals 44, 64, or 132a and 132b of FIGS. 1-3, respectively.

The BIST signal generator 210 can also include a control node 230, which can be the same as or similar to any of the nodes 42a, 62a, or 132a and 132b of FIGS. 1-3. The control node 230 is coupled to receive the built-in self-test control signal 48 of FIGS. 1-3.

In operation, the BIST signal generator 210 generates the digital self-test signal 228 during a particular state of the built-in self-test control signal 48 appearing at the control node 230. Therefore, the BIST signal generator 210 can be turned on or off by the state of the built-in self-test control signal 48.

When the BIST signal generator 210 is turned on, the digital self-test signal 226 is comprised of digital values that count up or down in any fashion determined by the state machine 216, until the BIST signal generator 210 is turned off by the built-in self-test control signal 48. Unlike the BIST signal generator 180 of FIG. 4A, the BIST signal generator 210 can preload the counter 224 with a value presented as the load count value 220 at any time synchronous with the clock signal 214. Therefore, the BIST signal generator 210 is able to generate the digital count value 226 with large or small jumps in value.

When converted to one of the analog self-test signals 60, 68, 136a, or 136b of FIGS. 1-3, the analog self-test signal can have any form determined by the state machine 216.

Furthermore, as described above in conjunction with FIG. 3, the resulting analog self-test signals 60, 68, 136a, or 136b can be determined in part by the feedback signal appearing at the feedback node 232.

The BIST signal generator 210 is able to generate the digital self-test signals 226 resulting in the analog self-test signals 60, 68, 136a, or 136b of FIGS. 1-3 having any of the above described characteristics. For example, when one channel is used as in FIGS. 1 and 2, the analog self-test signals 60, 68, 136a, or 136b can include a signal characteristic representative of proximity of a ferromagnetic article, a signal characteristic representative of a rotation of the ferromagnetic article, and/or a signal characteristic representative of a rotational or translational noise of the ferromagnetic article. When two channels are used as in FIG. 3, the analog self-test signals 136a, 136b can include a signal characteristic representative of proximity of the ferromagnetic article, a signal characteristic representative of a rotation of the ferromagnetic article, a signal characteristic representative of a direction of rotation of the ferromagnetic article, a signal characteristic representative of a change in direction of rotation of the ferromagnetic article, and/or a signal characteristic representative of a rotational or translational noise of the ferromagnetic article.

Figure 4C:
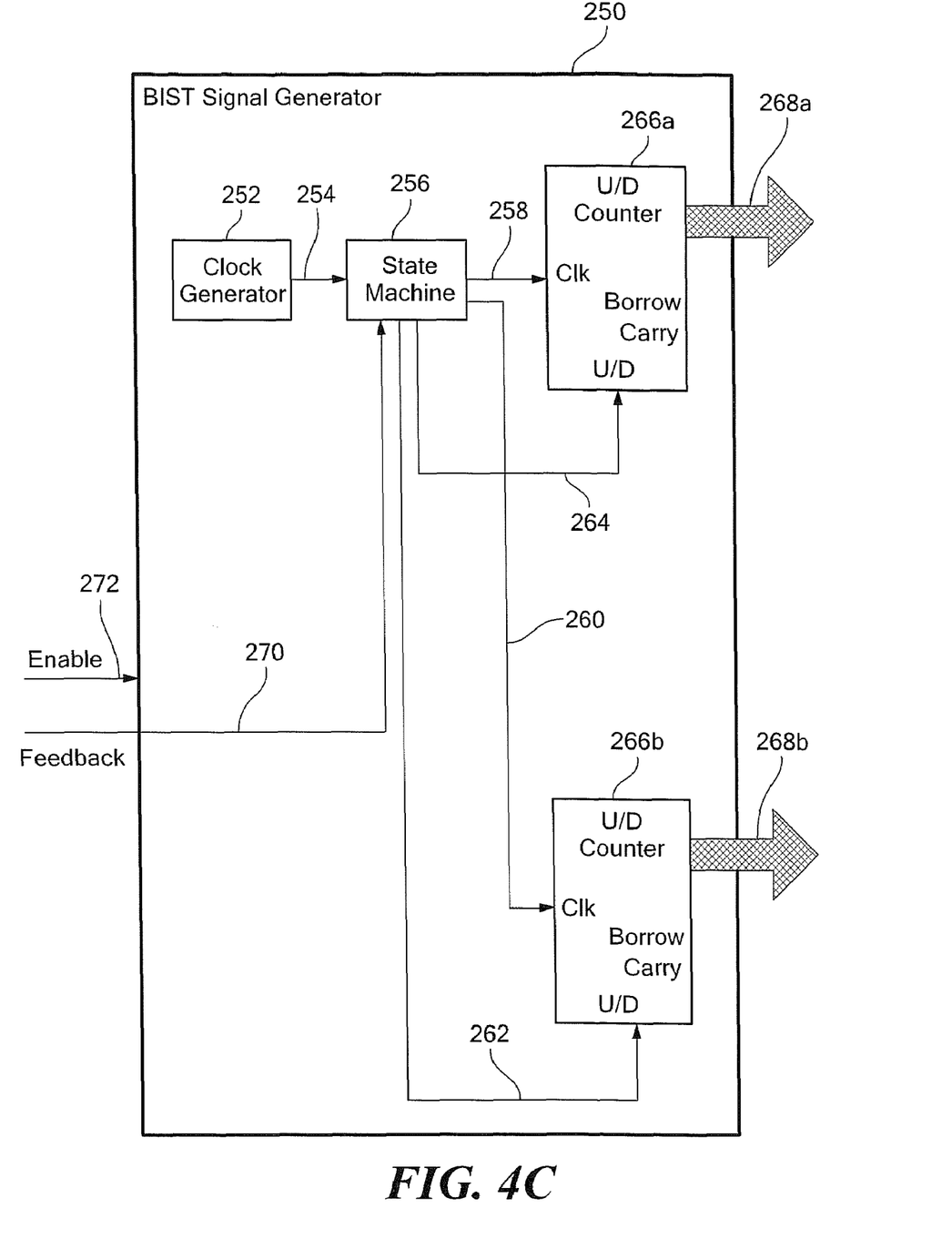
FIG. 4C is a block diagram showing yet another built-in self-test (BIST) signal generator that can be used in the integrated circuits of FIGS. 1-3.

Referring now to FIG. 4C, another BIST signal generator 250 can be the same as or similar to any of the BIST signal generators 42, 62, or 130a and 130b of FIGS. 1-3, respectively. However, the BIST signal generator 250 is particularly suitable for use in the two-channel integrated circuit 100 of FIG. 3. The BIST signal generator 250 is configured to receive the feedback signals 126a, 126b of FIG. 3 at a feedback node 268.

The BIST signal generator 250 can include a clock generator 252 configured to generate a digital clock signal 254. The BIST signal generator 250 can also include a state machine 256 coupled to receive the digital clock signal 254 and configured to generate a state machine clock signal 258, another state machine clock signal 260, an count direction control signal 264, and another count direction control signal 262.

The BIST signal generator 250 can also include a first counter 266a, which can be an up/down counter, coupled to receive the state machine clock signal 258 and the count direction control signal 264. The first counter 266a is configured to generate a digital self-test signal 268a. The digital self-test signal 268a can be the same as or similar to any of the digital self-test signals 44, 64, or 132a and 132b of FIGS. 1-3, respectively, but is most suitable to be the same as or similar to the digital self-test signal 132a of FIG. 3.

The BIST signal generator 250 can also include a second counter 266b, which can be an up/down counter, coupled to receive the state machine clock signal 260 and the count direction control signal 262. The second counter 266a is configured to generate a digital self-test signal 268b. The digital self-test signal 268b can be the same as or similar to any of the digital self-test signals 44, 64, or 132a and 132b of FIGS. 1-3, respectively, but is most suitable to be the same as or similar to the digital self-test signal 132b of FIG. 3.

The BIST signal generator 250 can also include a control node 272, which can be the same as or similar to any of the nodes 42a, 62a, or 132a and 132b of FIGS. 1-3. The control node 272 is coupled to receive the built-in self-test control signal 48 of FIGS. 1-3.

In operation, the BIST signal generator 250 generates the digital self-test signals 266a, 266b during a particular state of the built-in self-test control signal 48 appealing at the control node 272. Therefore, the BIST signal generator 250 can be turned on or off by the state of the built-in self-test control signal 48.

When the BIST signal generator 250 is turned on, the digital self-test signals 266a, 266b are each comprised of respective digital values that count up or down in any fashion determined by the state machine 256, until the BIST signal generator 210 is turned off by the built-in self-test control signal 48. The digital self-test signals 266a, 266b can be comprised of the same count values at the same time or different count values. With this particular arrangement, the digital self-test signals 266a, 266b can have signal characteristics that are synchronized with each other. For example the digital self-test signals 266a, 266b can have signal characteristics that result in a relative phase difference between the analog self-test signals 136a, 136b of FIG. 3, or in a phase change between the analog self-test signals 136a, 136b. It will be understood from discussion above in conjunction with FIG. 3 that the relative phase difference is representative of a rotational direction of the gear 86 of FIG. 3 and the change in phase difference is representative of a change in direction of rotation of the gear 86.

When the one of the digital self test signals 268a, 268b is converted to one of the analog self-test signals 60, 68, 136a, or 136b of FIGS. 1-3, the analog self-test signal can have any form determined by the state machine 256. Furthermore, as described above in conjunction with FIG. 3, the resulting analog self-test signals 60, 68, 136a, or 136b can be determined in part by the feedback signal appearing at the feedback node 270.

The BIST signal generator 250 is able to generate the digital self-test signals 266a, 266b resulting in the analog self-test signals 60, 68, 136a, or 136b of FIGS. 1-3 having any of the above described signal characteristics. For example, when but one channel is used as in FIGS. 1 and 2, the analog self-test signals 60, 68, 136a, or 136b can include a signal characteristic representative of proximity of a ferromagnetic article, a signal characteristic representative of a rotation of the ferromagnetic article, and/or a signal characteristic representative of a rotational or translational noise of the ferromagnetic article. When two channels are used as in FIG. 3, the analog self-test signals 136a, 136b can include a signal characteristic representative of proximity of the ferromagnetic article, a signal characteristic representative of a rotation of the ferromagnetic article, a signal characteristic representative of a direction of rotation of the ferromagnetic article, a signal characteristic representative of a change in direction of rotation of the ferromagnetic article, and/or a signal characteristic representative of a rotational or translational noise of the ferromagnetic article.

When used in a two-channel arrangement capable of detecting a direction of rotation and a change in direction of rotation as in FIG. 3, any of the BIST generators 150, 180, 210, 250 of FIGS. 4-4C, respectively, can generate digital self-test signals (e.g., 132a, 132b, FIG. 3) resulting in analog self-test signals (e.g., 136a, 136b, FIG. 3) that have slightly different frequencies, and which, therefore, walk past each other in phase. With this arrangement one of the analog self-test signals first leads the other in phase, and then the phase relationship reverses periodically. It will be understood that these analog self-test signals are representative of periodic reversals of direction of the gear 86 of FIG. 3.

The state machines 186, 216, 256 of FIGS. 4A-4C, respectively can be formed from a variety of electronic components. For example, in some embodiments, the state machines 186, 216, 256 are comprised of memory devices, for example read-only memory devices or programmable read-only memory devices. In other embodiments, the state machines 186, 216, 256 are comprised of programmable logic devices, for example programmable gate arrays. In still other embodiments, the state machines 186, 216, 256 are comprised of microcontrollers.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A method of built-in self-test in an integrated circuit, comprising:
   communicating a built-in self-test control signal to the integrated circuit;
   generating one or more analog self-test signals within the integrated circuit; and
   coupling the one or more analog self-test signals to a respective one or more offset control nodes within the integrated circuit in response to the communicating.

2. The method of claim 1, further comprising representing a proximity of a ferromagnetic object with a characteristic of at least one of the analog self-test signals.

3. The method of claim 1, further comprising representing a rotation of a ferromagnetic object with a characteristic of at least one of the analog self-test signals.

4. The method of claim 3, wherein the one or more analog self-test signals comprise a first analog self-test signal and a second analog self-test signal, wherein the method further comprises representing a direction of rotation of the ferromagnetic object with a relative phase between the first and second analog self-test signals.

5. The method of claim 4, wherein the method further comprises representing a change of direction of rotation of the ferromagnetic object with a relative phase change between the first and second analog self-test signals.

6. The method of claim 1, further comprising representing a vibration of a ferromagnetic object with a characteristic of at least one of the analog self-test signals.

7. The method of claim 6, wherein the one or more analog self-test signals comprise a first analog self-test signal and a second analog self-test signal, wherein the characteristic comprises a relative phase change between the first and second analog self-test signals.

8. The method of claim 6, wherein the characteristic comprises an amplitude modulation of the at least one of the one or more analog self-test signals.

9. The method of claim 1, further comprising:
generating one or more magnetic field signals with a respective one or more magnetic field sensing elements, wherein the coupling the one or more analog self-test signals to the respective one or more offset control nodes comprises summing the analog self-test signals with respective ones of the one or more magnetic field signals.

10. The method of claim 1, further comprising:
generating a first magnetic field signal with a first pair of magnetic field sensing elements; and
generating a second magnetic field signal with a second pair of magnetic field sensing elements, wherein the coupling the one or more analog self-test signals to the respective one or more offset control nodes comprises:
summing a first one of the one or more analog self-test signals with the first magnetic field signal; and
summing a second one of the one or more analog self-test signals with the second magnetic field signal.

11. An integrated circuit, comprising:
one or more built-in self-test signal generators for generating a respective one or more digital self-test signals;
one or more digital-to-analog converters coupled respectively to the one or more built-in self-test signal generators, the one or more digital-to-analog converters for generating a respective one or more analog self-test signals in response to the one or more digital self-test signals;
a built-in self-test control node for receiving a built-in self-test control signal; and
one or more offset control nodes coupled to receive respectively the one or more analog self-test signals in response to the built-in self-test control signal.

12. The method of claim 11, wherein a characteristic of at least one of the analog self-test signals is representative of a proximity of a ferromagnetic object.

13. The integrated circuit of claim 11, wherein a characteristic of at least one of the analog self-test signals is representative of a rotation of a ferromagnetic object.

14. The integrated circuit of claim 13, wherein the one or more analog self-test signals comprise a first analog self-test signal and a second analog self-test signal, wherein a relative phase between the first and second analog self-test signals is representative of a direction of rotation of the ferromagnetic object.

15. The method of claim 14, wherein a relative phase change between the first and second analog self-test signals is representative of a change of direction of rotation of the ferromagnetic object.

16. The integrated circuit of claim 11, wherein a characteristic of at least one of the analog self-test signals is representative of a vibration of a ferromagnetic object.

17. The integrated circuit of claim 16, wherein the one or more analog self-test signals comprise a first analog self-test signal and a second analog self-test signal, wherein the characteristic comprises a relative phase change between the first and second analog self-test signals.

18. The integrated circuit of claim 16, wherein the characteristic comprises an amplitude modulation of the at least one of the one or more analog self-test signals.

19. The integrated circuit of claim 11, further comprising one or more magnetic field sensing elements for generating a respective one or more magnetic field signals, wherein the one or more offset control nodes are further coupled to receive respectively the one or more magnetic field signals to provide respective sums of the one or more magnetic field signals with the one or more analog self-test signals.

20. The integrated circuit of claim 11, wherein the one or more of the built-in self-test signal generators comprise:
one or more respective clock generators for generating one or more respective clock signals; and
one or more respective up/down counters coupled respectively to the one or more clock generators, the one or more up/down counters for generating the one or more digital self-test signals, wherein the one or more digital-to-analog converters are coupled respectively to receive the one or more digital self-test signals.

21. The integrated circuit of claim 20, wherein the one or more the built-in self-test signal generators further comprise a respective one or more logic circuits coupled respectively to the one or more up/down counters for reversing a count direction.

22. The integrated circuit of claim 20, wherein the one or more built-in self-test signal generators further comprise a respective one or more state machines coupled respectively between the one or more clock generators and the one or more up-down counters.

23. The integrated circuit of claim 11, further comprising one or more logic circuits coupled respectively between the one or more built-in self-test signal generators and the one or more digital-to-analog converters, wherein the one or more logic circuits comprise a respective one or more logic circuit control nodes coupled to the built-in self-test control node, the one or more logic circuit control nodes for controlling coupling of the one or more analog self-test signals to the respective one or more offset control nodes.

24. The integrated circuit of claim 11, further comprising:
a first pair of magnetic field sensing elements for generating a first magnetic field signal; and
a second pair of magnetic field sensing elements for generating a second magnetic field signal, wherein the one or more offset control nodes comprise:
a first offset control node to sum a first one of the one or more analog self-test signals with the first magnetic field signal; and
a second offset control node to sum a second one of the one or more analog self-test signals with the second magnetic field signal.

25. The integrated circuit of claim 11, further comprising at least one of a peak detector circuit coupled to one of the one or more offset control nodes for detecting a peak of a first signal representative of a selected one of the one or more analog self-test signals or a threshold detector circuit coupled to one of the one or more offset control nodes for detecting a threshold crossing of the first signal representative of the selected one of the one or more analog self-test signals.

26. The integrated circuit of claim 25, further comprising a vibration processor coupled to the at least one of the peak detector circuit or the threshold detector circuit for detecting at least one of a first vibration signal in the first signal representative of the selected one of the one or more analog self-test signals or a second vibration signal in a second signal representative of another selected one of the one or more analog self-test signals.

* * * * *

UNITED STATES PATENT AND TRADEMARK OFFICE
CERTIFICATE OF CORRECTION

PATENT NO. : 7,694,200 B2  
APPLICATION NO. : 11/779354  
DATED : April 6, 2010  
INVENTOR(S) : Glenn Forrest et al.

It is certified that error appears in the above-identified patent and that said Letters Patent is hereby corrected as shown below:

Drawings, Fig. 3 delete "136aa" and replace with --136a--.

Column 8, line 35 delete "be also" and replace with --also be--.

Column 8, line 64 delete "signals that" and replace with --that--.

Column 9, line 21 delete "signal" and replace with --signals--.

Column 9, line 26 delete "signal" and replace with --signals--.

Column 9, line 30 delete "signal" and replace with --signals--.

Column 9, lines 40-41 delete "respective a self-test signals to emulates" and replace with --respective self-test signals to emulate--.

Column 9, lines 53-54 delete "the characteristic" and replace with --the signal characteristic--.

Column 10, line 9 delete "FIG. 103," and replace with --FIGS. 1-3,--.

Column 10, line 26 delete "an" and replace with --a--.

Column 10, line 62 delete "and" and replace with --a--.

Column 11, line 27 delete "signals 192" and replace with --signal 192--.

Column 11, line 29 delete "above described" and replace with --above-described--.

Column 12, line 29 delete "signals 226" and replace with --signal 226--.

Column 12, line 31 delete "above described" and replace with --above-described--.

Signed and Sealed this

Twelfth Day of October, 2010

David J. Kappos  
*Director of the United States Patent and Trademark Office*

Column 12, line 61 delete ", an" and replace with --, a--.

Column 13, line 55 delete "above described" and replace with --above-described--.

Column 16, line 19 delete "more the built-in" and replace with --more built-in--.